(12) United States Patent
Zhang et al.

(10) Patent No.: US 11,800,668 B2
(45) Date of Patent: Oct. 24, 2023

(54) LED DISPLAY SCREEN BOX

(71) Applicant: SHENZHEN GLOSHINE TECHNOLOGY CO., LTD., Guangdong (CN)

(72) Inventors: Xianfeng Zhang, Guangdong (CN); Yongjun Zhang, Guangdong (CN); Guoqiang Li, Guangdong (CN); Zhencheng Huang, Guangdong (CN); Xijian Chen, Guangdong (CN)

(73) Assignee: SHENZHEN GLOSHINE TECHNOLOGY CO., LTD., Shenzhen (CN)

( * ) Notice: Subject to any disclaimer, the term of this patent is extended or adjusted under 35 U.S.C. 154(b) by 266 days.

(21) Appl. No.: 17/427,914

(22) PCT Filed: Apr. 16, 2021

(86) PCT No.: PCT/CN2021/087800
§ 371 (c)(1),
(2) Date: Aug. 3, 2021

(87) PCT Pub. No.: WO2022/134396
PCT Pub. Date: Jun. 30, 2022

(65) Prior Publication Data
US 2022/0408577 A1    Dec. 22, 2022

(30) Foreign Application Priority Data

Dec. 21, 2020 (CN) .......................... 202023107818.3

(51) Int. Cl.
*H05K 5/02* (2006.01)

(52) U.S. Cl.
CPC ......... *H05K 5/0226* (2013.01); *H05K 5/0247* (2013.01)

(58) Field of Classification Search
None
See application file for complete search history.

(56) References Cited

U.S. PATENT DOCUMENTS 8,042,698 B2 * 10/2011 Kim ...................... F16M 13/02
                                                                211/78
9,414,503 B2 *  8/2016 Lee ........................ G09F 9/3026
(Continued)

FOREIGN PATENT DOCUMENTS

CN        203503255 U      3/2014
CN        204332270 U      5/2015
(Continued)

*Primary Examiner* — Xanthia C Relford

(57) ABSTRACT

The application provides an LED display screen box, comprising a box frame, an LED module and a sheet metal door panel; the LED module comprises a mounting plate, an LED lamp panel and a power box, the LED module is fixed on the front of the box frame by a module side lock; the power box of LED module includes a socket and a protective cover. The LED module can be removed from the front of the box frame, so that the connection stability is ensured and the disassembly can be performed from the front. The LED display screen box can be repaired or changed efficiently and quickly, so the problem that the LED display screen box is difficult to maintain is solved. The protective cover on the power box of LED module can improve the waterproof performance of the power box, its waterproof grade can reach IP65.

9 Claims, 3 Drawing Sheets

(56) References Cited

U.S. PATENT DOCUMENTS

| | | | | |
|---|---|---|---|---|
| 9,477,438 B1* | 10/2016 | Hochman | ............ | H01R 13/665 |
| 2008/0285219 A1* | 11/2008 | Podd | ....................... | G09F 13/22 |
| | | | | 361/679.01 |
| 2009/0225506 A1* | 9/2009 | Lee | ...................... | H05K 5/0017 |
| | | | | 29/469 |
| 2013/0265765 A1* | 10/2013 | Liang | .................. | H05K 5/0208 |
| | | | | 362/249.02 |
| 2015/0362160 A1* | 12/2015 | Andreasen | ................ | G09F 9/33 |
| | | | | 362/97.1 |
| 2016/0169456 A1* | 6/2016 | Yang | ........................ | F21K 9/20 |
| | | | | 362/249.02 |
| 2016/0210886 A1* | 7/2016 | Brashnyk | .............. | F16M 11/041 |
| 2016/0255731 A1* | 9/2016 | Ran | ..................... | H05K 5/0221 |
| | | | | 361/807 |
| 2017/0114971 A1* | 4/2017 | Cross | ....................... | G09G 5/14 |
| 2017/0202098 A1* | 7/2017 | Gou | .......................... | H05K 5/0204 |
| 2017/0220310 A1* | 8/2017 | Hochman | .......... | H01R 13/6205 |
| 2019/0159349 A1* | 5/2019 | Yi | .......................... | G09F 9/3026 |
| 2019/0295459 A1* | 9/2019 | Gou | .......................... | G09F 9/33 |
| 2020/0063767 A1* | 2/2020 | Jung | ....................... | H05K 5/03 |
| 2020/0064677 A1* | 2/2020 | Yoon | .................... | G09F 9/3026 |
| 2020/0080683 A1* | 3/2020 | Flowers | ............... | F16M 11/041 |
| 2020/0372842 A1* | 11/2020 | Guan | ....................... | G09F 9/33 |
| 2021/0005585 A1* | 1/2021 | Wu | .......................... | G09F 9/33 |

FOREIGN PATENT DOCUMENTS

| | | | | | |
|---|---|---|---|---|---|
| CN | 107134227 | A | | 9/2017 | |
| CN | 207217015 | U | | 4/2018 | |
| CN | 110197629 | A | * | 9/2019 | ........... G06F 3/1446 |
| CN | 210443175 | U | | 5/2020 | |
| CN | 212873929 | U | | 4/2021 | |

* cited by examiner

LED DISPLAY SCREEN BOX

The present application claims the priority of a Chinese patent application (No. 202023107818.3) filed with China Patent Office on Dec. 21, 2020 and entitled "An LED display screen box", the contents of which are incorporated in this application by reference in their entirety.

TECHNICAL FIELD

The application relates to the technical field of LED display screens, in particular to an LED display screen box.

BACKGROUND

With the continuous development of LED display technology, LED display has become a popular outdoor display tool. However, during the long-term outdoor use of LED display screen, some of the LED lamps on the panel are prone to failure, which affects the display effect of the whole LED display screen. How to deal with the failure of outdoor LED display quickly and efficiently is an urgent technical problem to be solved. In order to facilitate the subsequent use and maintenance of the existing outdoor LED display screen, a maintenance solution from the front of the LED has been adopted, that is, the LED module can be removed from the front of the LED display screen to replace or repair a single component. For the maintenance solution from the front of the LED, the LED module is usually fixed on the frame structure by magnetic attraction, but the magnetic attraction structure is prone to moving or even falling off during transportation, and even in the subsequent outdoor use, the problem of unstable connection is likely to occur.

SUMMARY

The purpose of the present application is to provide an LED display screen box, which overcomes the shortcomings that the existing outdoor LED display screen cannot realize the bidirectional maintenance solution of opening the LED from front and back at the same time, and the problem of the unstable connection between the LED module and frame structure fixed by magnetic attraction.

The technical solution adopted by the present application is to provide an LED display screen box, including a box frame, at least one LED module arranged at the front of the box frame, and at least one sheet metal door panel arranged at the back of the box frame; the LED module includes a mounting plate, an LED lamp panel arranged on the front of the mounting plate, and a power box arranged on the back of the mounting plate and electrically connected with the LED lamp panel; the back of the mounting plate is provided with at least two oppositely arranged module side locks, and the LED module is fixed on the front of the box frame by the module side lock; the power box of the LED module includes a socket electrically connected with the LED lamp panel, and a protective cover arranged on the socket and capable of covering the socket.

Furthermore, the box frame includes an outer frame arranged in a rectangular shape, and an inner frame arranged inside the outer frame and perpendicular to each other; a lock tongue of the module side lock of the LED module rotatably abuts against the inner frame.

Furthermore, the back of the mounting plate of the LED module is provided with a plurality of first positioning posts, and the inner frame is provided with a first positioning hole for insertion of the first positioning post.

Furthermore, the socket includes a base fixed on the back of the mounting plate, a power signal seat arranged on the base, a first connecting seat and a second connecting seat arranged on the base and positioned on both sides of the power signal seat.

Specifically, the protective cover includes a transparent cover body capable of covering the power signal seat, a first connecting part arranged on one side of the transparent cover body and hinged with the first connecting seat, and a second connecting part arranged on the other side of the transparent cover body and engaged with the second connecting seat.

Specifically, the first connecting seat is a pair of hinged seats arranged on the base and positioned above the power signal seat, and the first connecting part is a pair of connecting arms extending from the transparent cover body to the pair of hinged seats, and the connecting arm is hinged with the hinged seat.

Specifically, the second connecting seat is a connecting block extending downward from the power signal seat, the second connecting part is an L-shaped elastic sheet arranged on a side wall of the transparent cover body, and the L-shaped elastic sheet is in a snap-fit connection with the connecting block, a groove is arranged on the connecting block, the connecting block is provided with a groove, and the L-shaped elastic sheet is provided with a hook which can be inserted into the groove.

Furthermore, the inner frame is further provided with a plurality of first connecting holes, the mounting plate of the LED module is provided with a second connecting hole corresponding to the first connecting hole, and the LED module is fixedly connected with the inner frame by a connecting piece.

Furthermore, the outer frame is provided with a threading hole for wires to pass through, a second positioning post on one side and a second positioning hole on the other side.

Furthermore, the inner side of the outer frame is provided with a slot for inserting a side edge of the sheet metal door panel; one side edge of the sheet metal door panel is inserted into the slot, and the other side edge is provided with a door panel side lock movably connected with the outer frame.

The LED display screen box provided by the application has the beneficial effects that the LED display screen box includes a box frame, an LED module and a sheet metal door panel, wherein the LED module arranged at the front of the box frame is fixed by a module side lock, therefore, the LED module can be removed from the front of the box frame, which not only ensures the stability of connection between the LED module and the box frame, but also can be removed from the front of the box frame, thus efficiently and quickly realizing the maintenance and change of the LED display screen box and solving the problem of difficult maintenance from the front of the LED display screen box. At the same time, a protective cover is provided on the power box of the LED module, which can improve the waterproof performance of the power box, its waterproof grade can reach IP65, thus ensuring the stability of the LED display screen box when used in harsh outdoor environment.

Figure 1:
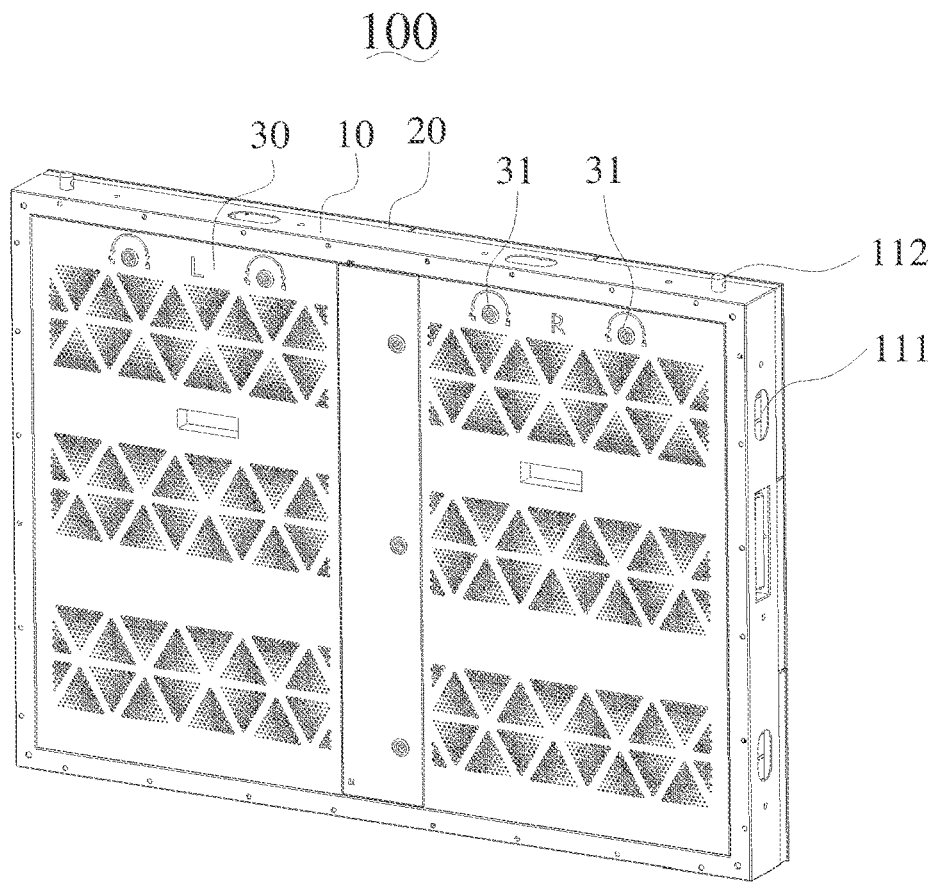
FIG. 1 is a schematic diagram of a three-dimensional structure of the LED display screen box provided by this application.
Figure 2:
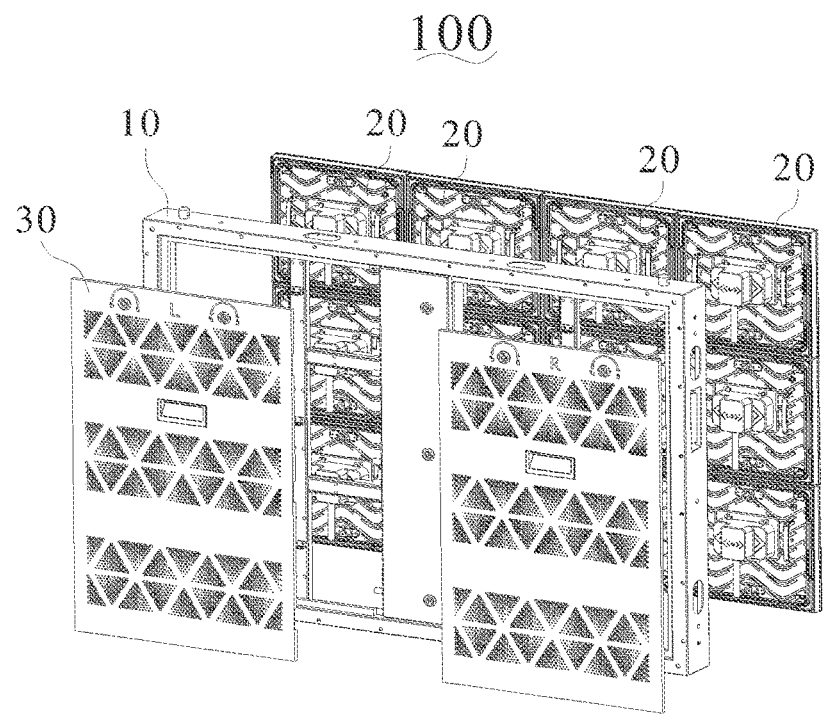
FIG. 2 is a schematic diagram of an exploded three-dimensional structure of the LED display screen box provided by this application.

In the drawing; 100. LED display screen box; 10. Box frame; 11. Outer frame; 111. Threading hole; 112. Second positioning hole; 113. Slot; 12. Inner frame; 121. First positioning hole; 122. First connecting hole; 20. LED module; 21. Mounting plate; 211. First positioning post; 212. Second connecting hole; 22. LED lamp panel; 23. Power box; 231. Socket; 2311. Base; 2312. Power signal seat; 2313. First connecting seat; 2314. Second connecting seat; 2315. Groove; 232. Protective cover; 2321. Transparent cover body; 2322. First connecting part; 2323. Second connecting part; 2324. Hook; 24. Module side lock; 241. Lock tongue; 30. Sheet metal door panel; 31. Door panel side lock.

DETAILED DESCRIPTION

In order to make the purpose, technical solutions and technical effects of the application clearer, the application will be further described in detail with reference to the drawings and embodiments. It should be understood that the embodiments described below are merely used to illustrate the application, and not intended to limit the application.

Referring to FIGS. 1-6, an LED display screen box 100 is provided in this application. The LED display screen box 100 can be stacked up and spliced to form LED displays of various sizes, which can be installed on indoor or outdoor walls or supports for display. A large LED display screen can be split into several LED display screen boxes 100, which not only facilitates the transportation and installation of the LED display screen, but also facilitates the regular maintenance and repair in the subsequent use.

Figure 3:
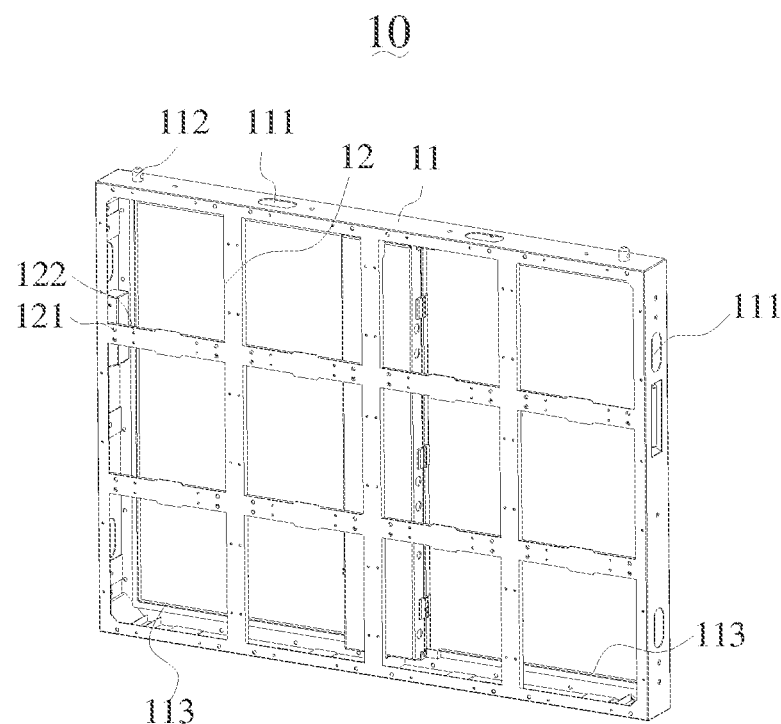
FIG. 3 is a schematic diagram of a three-dimensional structure of the box frame of the LED display screen box provided by this application.

Specifically, as shown in FIG. 1, an LED display screen box 100 provided by this application includes a box frame 10, at least one LED module 20 arranged on the front of the box frame 10, and at least one sheet metal door panel 30 arranged on the back of the box frame 10. As shown in FIG. 3, the box frame 10 provided by this application is an integral supporting structure. In this embodiment, the front of the same box frame 10 can be provided with 12 LED modules 20, and the back of the box frame 10 can be provided with two sheet metal door panels 30. The size of the box frame 10 can be adjusted as required to be suitable for the installation and use of LED modules 20 of different sizes. According to the LED display screen box 100 provided by this application, the LED module 20 can be directly removed from the front of the box, so as to realize maintenance from the front of the LED display screen. Also, the LED module 20 can be maintained by opening the sheet metal door panel 30 from the back. Therefore, both sides of the front and back can be opened for maintenance, the maintenance of the LED display screen can be completed more efficiently and quickly.

Figure 4:
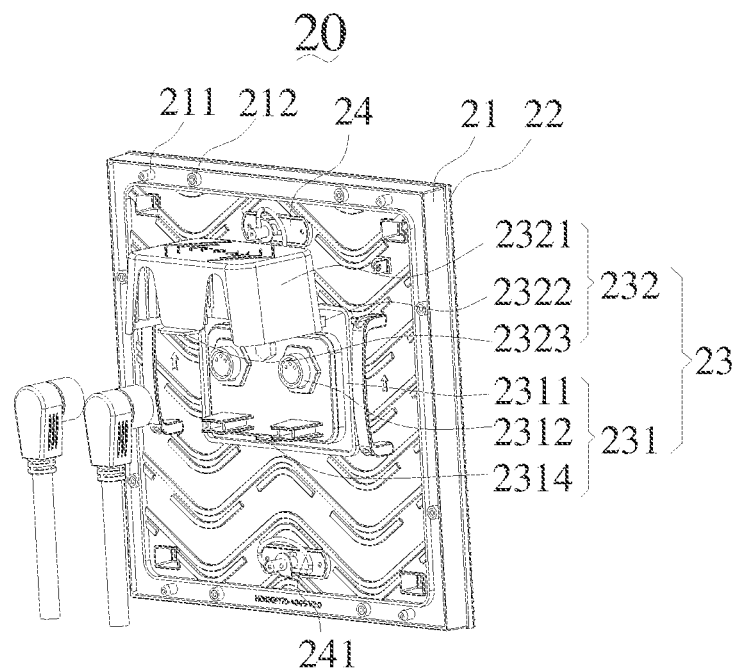
FIG. 4 is a schematic diagram of a three-dimensional structure of the LED module of the LED display screen box provided by this application.
Figure 5:
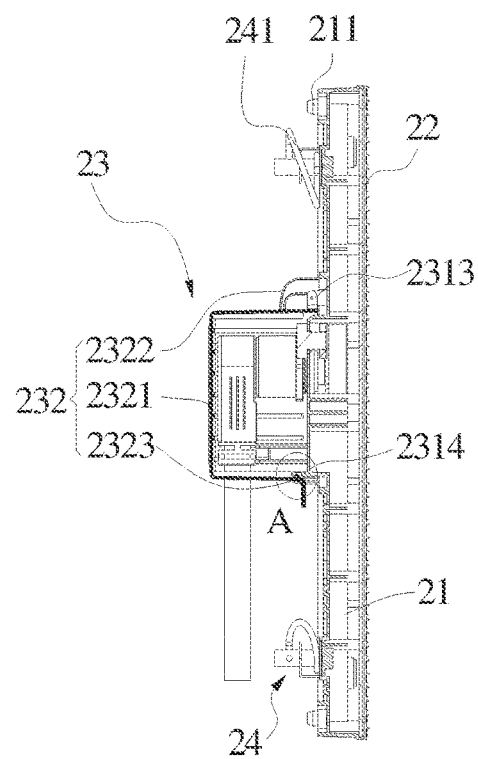
FIG. 5 is a cross-sectional view of the LED module of the LED display screen box provided by this application.
Figure 6:
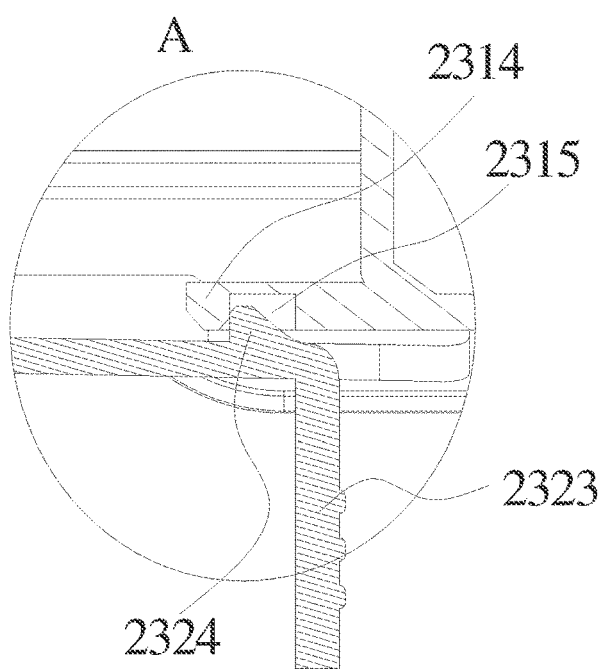
FIG. 6 is a partial enlarged view of A in FIG. 5.

Specifically, as shown in FIGS. 4-6, the LED module 20 includes a mounting plate 21, an LED lamp panel 22 arranged on the front of the mounting plate 21, and a power box 3 arranged on the back of the mounting plate 21 and electrically connected with the LED lamp panel 22. The LED lamp panel 22 is arranged on the front of the mounting plate 21 for display, and the power box 23 in the mounting plate 21 provides a signal source and a power supply for the LED lamp panel 22 at the same time, thereby realizing the control of the LED lamp panel 22. The power box 23 is fixed inside the box frame 10, which is convenient for wire management and waterproof and dustproof process at the power interface.

Furthermore, as shown in FIG. 4, the back of the mounting plate 21 in the LED display screen box 100 provided by the present application is provided with at least two oppositely arranged module side locks 24, and the LED module 20 is fixed on the front of the box frame 10 by the module side lock 24. In this embodiment, the upper and lower sides of the mounting plate 21 are respectively provided with a module side lock 24, and the LED module 20 located at the front of the box frame 10 is movably connected with the box frame 10 by the module side lock 24 from the upper and lower sides. When the lock tongue 241 of the module side lock 24 abuts on the box frame 10, it can be fixedly connected with the box frame 10. The lock tongue 241 can be rotated by a tool to separate the lock tongue 241 from the box frame 10, thereby the LED module 20 is separated from the box frame 10. The LED module 20 provided by this application realizes the connection with the box frame 10 through the module side lock 24, which ensures the stability of the connection between the LED module 20 and the box frame 10 when they are fixedly connected, and avoids the separation between the LED module 20 and the box frame 10 due to transportation or other reasons. At the same time, when necessary, the LED module 20 can be removed from the front of the box frame 10, so that the LED module 20 can be maintained separately.

Furthermore, as shown in FIG. 4, in the LED display screen box 100 provided by this application, the power box 23 of the LED module 20 includes a socket 231 electrically connected with the LED lamp panel 22, and a protective cover 232 arranged on the socket 231 and capable of covering the socket 231. The protective cover 232 can not only improve the beauty of the socket 231, but also improve the waterproof and dustproof effect of the socket 231, so that the LED display screen box 100 provided by this application can be used outdoors under more severe environmental conditions. The waterproof grade of the whole LED display screen box 100 can reach as high as IP65 with the arrangement of the protective cover 232.

Furthermore, as shown in FIG. 3, in the LED display screen box 100 provided by this application, the box frame 10 includes an outer frame 11 arranged in a rectangular shape, and an inner frame 12 arranged inside the outer frame 11 and perpendicular to each other. The outer frame 11 has a rectangular frame structure, and in the rectangular frame structure, a plurality of cross beams are arranged in parallel with each other, and a plurality of longitudinal beams are arranged in parallel with each other, the cross beams and longitudinal beams are integrally formed as an inner frame 12 arranged inside the outer frame 11. On the cross beam of the inner frame 12, there are a plurality of blocking plates for fixing the LED module 20, and the lock tongue 241 of the module side lock 24 of the LED module 20 can rotatably abut against the blocking plates of the inner frame 12, thus realizing the fixed connection between the LED module 20 and the inner frame 12.

As shown in FIG. 4, a plurality of first positioning posts 211 are provided on the back of the mounting plate 21 of the LED module 20. Accordingly, as shown in FIG. 3, the inner frame 12 of the box frame 10 is provided with a first positioning hole 121 into which the first positioning post 211 can be inserted. When fixing the LED module 20, the first positioning post 211 on the mounting plate 21 is inserted into the first positioning hole 121 of the inner frame 12, so that the LED module 20 is preliminarily fixed with the box frame 10. Then, the lock tongue 241 of the module side lock 24 is rotated to abut on the blocking plate of the inner frame 12, thereby fixing the LED module 20 to the box frame 10.

Specifically, as shown in FIG. 4, the socket 231 on the mounting plate 21 includes a base 2311 fixed on the back of the mounting plate 21, a power signal seat 2312 arranged on the base 2311, a first connecting seat 2313 and a second connecting seat 2314 arranged on the base 2311 and positioned on both sides of the power signal seat 2312. On the base 2311, the power signal seat 2312 can be either a single connection structure, which connects the power supply and the signal source at the same time through one port; or a double connection structure, which connects the power supply and the signal source at the same time through two ports, realizing the connections of circuit and signal at the same time. The first connecting seat 2313 and the second connecting seat 2314 are positioned on the upper and lower sides of the power signal seat 2312 respectively, to realize and protect the fixed connection of the protective cover 232.

Furthermore, as shown in FIG. 4, the protective cover 232 includes a transparent cover body 2321 capable of covering the power signal seat 2312, a first connecting part 2322 arranged on one side of the transparent cover body 2321 and hinged with the first connecting seat 2313, and a second connecting part 2323 arranged on the other side of the transparent cover body 2321 and engaged with the second connecting seat 2314. The transparent cover body 2321 has a cuboid structure, and a cavity for accommodating the power signal seat 2312 and the plug; the side wall of the transparent cover body 2321 is further provided with a notch for the power line and/or the signal line to pass through. At the same time, the side with the notch is provided with a second connecting part 2323, and the transparent cover body 2321 can be opened or closed to the power signal seat 2312 through the second connecting part 2323.

Specifically, as shown in FIG. 4 and FIG. 5, the first connecting seat 2313 is a pair of hinged seats arranged on the base 2311 and positioned above the power signal seat 2312, and the first connecting part 2322 is a pair of connecting arms extending from the transparent cover body 2321 to the pair of hinged seats, and the connecting arm is hinged with the hinged seat. The pair of connecting arms of the protective cover 232 are hinged with the pair of hinged seats arranged on the base 2311, so that the top of the protective cover 232 can be hinged with the base 2311, and the other end of the protective cover 232 can be opened or closed to the base 2311.

As shown in FIG. 5, the second connecting seat 2314 positioned on the other side of the first connecting seat 2313 on the base 2311 is a connecting block extending downward from the power signal seat 2312, the second connecting part 2323 is an L-shaped elastic sheet arranged on a side wall of the transparent cover body 2321, and the L-shaped elastic sheet is in a snap-fit connection with the connecting block, the connecting block is provided with a groove 2315, and the L-shaped elastic sheet is provided with a hook 2324 which can be inserted into the groove 2315. The groove 2315 arranged on the connecting block is clamped with hook 2324 on transparent cover body 2321. When power signal seat 2312 needs to be closed, only the side of transparent cover body 2321 with the L-shaped elastic sheet needs to move toward the base 2311, so that the hook 2324 is embedded in the groove 2315, and one end of the transparent cover body 2321 is correspondingly fixed on the base 2311 because the hook 2324 is clamped with the groove 2315. When the power signal seat 2312 needs to be opened, it is only necessary to pry the end of the L-shaped elastic piece to make the hook 2324 slides out of the groove 2315, so that the side of the transparent cover body 2321 with the L-shaped elastic piece can be separated from the base 2311, therefore the socket on the power signal seat 2312 can be plugged or unplugged.

Furthermore, as shown in FIGS. 3 and 4, the inner frame 12 of the box frame 10 is further provided with a plurality of first connecting holes 122, the mounting plate 21 of the LED module 20 is provided with a second connecting hole 212 corresponding to the first connecting hole 122, and the LED module 20 is fixedly connected with the inner frame 12 by a connecting piece. To further ensure the stability between the LED module 20 and the box frame 10, the LED module 20 can also be fixedly connected with the inner frame 12 by a connecting piece. If the LED module 20 is fixed on the inner frame 12 by a connecting piece, the LED module 20 can be disassembled only by opening the box frame 10 from the back.

Furthermore, as shown in FIG. 3, the outer frame 11 of the box frame 10 is provided with a threading hole 111 for threading wires, a second positioning post 112 on one side and a second positioning hole (not shown in the figure) on the other side. The LED display screen box 100 provided by the application can be spliced into LED displays of various shapes and sizes with a plurality of boxes. In the process of splicing, the second positioning post 112 on the box frame 10 is inserted into the second positioning hole of the other adjacent box frame 10, so that they are mutually spliced. And the arrangement of threading hole 111 can realize the mutual communication of circuits between the adjacent LED display screen boxes 100.

Furthermore, as shown in FIG. 3, in the LED display screen box 100 provided by this application, the inner side of the outer frame is provided with a slot 113 for inserting a side edge of the sheet metal door panel 30; one side edge of the sheet metal door panel 30 is inserted into the slot 113, and the other side edge is provided with a door panel side lock 31 movably connected with the outer frame 11. The sheet metal door panel 30 is arranged on the back of the box frame 10. The opening of the sheet metal door pane 130 enables a user to debug, repair and maintain the LED module 20 from the back of the LED display screen box 100.

The LED display screen box 100 provided by the application includes a box frame 10, an LED module 20 and a sheet metal door panel 30, wherein the LED module 20 arranged at the front of the box frame 10 is fixed by a module side lock 24. Therefore, the LED module 20 can be removed from the front of the box frame 10, which not only ensures the stability of the connection between the LED module 20 and the box frame 10, but also the components can be removed from the front of the box frame 10, thus efficiently and quickly realizing the maintenance or change of the LED display screen box, and solving the problem of difficult maintenance from the front of the LED display screen box.

Meanwhile, in the LED display screen box 100 provided by this application, a protective cover 232 is provided on the power box 23 of the LED module 20, the waterproof performance of the power box 23 can be improved by the protective cover 232, so that the waterproof grade can reach IP65, thus ensuring the stability of the LED display screen box when used in harsh outdoor environments.

The above descriptions are only preferred embodiments of the present application and are not intended to limit the present application. Any modification, equivalent substitution and improvement made within the spirit and principles of the present application shall be included within the scope of protection of the present application.

What is claimed is:

1. An LED display screen box, comprising a box frame, at least one LED module arranged at the front of the box frame, and at least one sheet metal door panel arranged at the back of the box frame; the LED module comprises a mounting plate, an LED lamp panel arranged on the front of the mounting plate, and a power box arranged on the back of the mounting plate and electrically connected with the LED lamp panel; the back of the mounting plate is provided with at least two oppositely arranged module side locks, and the LED module is fixed on the front of the box frame by the module side lock; the power box of the LED module comprises a socket electrically connected with the LED lamp panel, and a protective cover arranged on the socket and capable of covering the socket; and the socket comprises a base fixed on the back of the mounting plate, a power signal seat arranged on the base, a first connecting seat and a second connecting seat arranged on the base and positioned on both sides of the power signal seat.

2. The LED display screen box of claim 1, wherein the box frame comprises an outer frame arranged in a rectangular shape, and an inner frame arranged inside the outer frame and perpendicular to each other; a lock tongue of the module side lock of the LED module rotatably abuts against the inner frame.

3. The LED display screen box of claim 2, wherein the back of the mounting plate of the LED module is provided with a plurality of first positioning posts, and the inner frame is provided with a first positioning hole for insertion of the first positioning post.

4. The LED display screen box of claim 2, wherein the inner frame is further provided with a plurality of first connecting holes, the mounting plate of the LED module is provided with a second connecting hole corresponding to the first connecting hole, and the LED module is fixedly connected with the inner frame by a connecting piece.

5. The LED display screen box of claim 2, wherein the outer frame is provided with a threading hole for wires to pass through, a second positioning post on one side and a second positioning hole on the other side.

6. The LED display screen box of claim 2, wherein the inner side of the outer frame is provided with a slot for inserting a side edge of the sheet metal door panel; one side edge of the sheet metal door panel is inserted into the slot, and the other side edge is provided with a door panel side lock movably connected with the outer frame.

7. The LED display screen box of claim 1, wherein, the protective cover comprises a transparent cover body capable of covering the power signal seat, a first connecting part arranged on one side of the transparent cover body and hinged with the first connecting seat, and a second connecting part arranged on the other side of the transparent cover body and engaged with the second connecting seat.

8. The LED display screen box of claim 7, wherein the first connecting seat is a pair of hinged seats arranged on the base and positioned above the power signal seat, and the first connecting part is a pair of connecting arms extending from the transparent cover body to the pair of hinged seats, and the connecting arm is hinged with the hinged seat.

9. The LED display screen box of claim 7, wherein the second connecting seat is a connecting block extending downward from the power signal seat, the second connecting part is an L-shaped elastic sheet arranged on a side wall of the transparent cover body, and the L-shaped elastic sheet is in a snap-fit connection with the connecting block, a groove is arranged on the connecting block, the connecting block is provided with a groove, and the L-shaped elastic sheet is provided with a hook which can be inserted into the groove.

* * * * *